United States Patent [19]

Rodwell et al.

[11] Patent Number: 5,014,018

[45] Date of Patent: May 7, 1991

[54] NONLINEAR TRANSMISSION LINE FOR GENERATION OF PICOSECOND ELECTRICAL TRANSIENTS

[75] Inventors: Mark J. W. Rodwell, Palo Alto; David M. Bloom, Portola Valley, both of Calif.

[73] Assignee: Stanford University, Stanford, Calif.

[21] Appl. No.: 106,554

[22] Filed: Oct. 6, 1987

[51] Int. Cl.⁵ .......................................... H03K 3/313
[52] U.S. Cl. ..................................... 333/20; 307/263; 333/247; 357/15
[58] Field of Search ................. 333/20, 247; 307/263, 307/320; 328/65; 357/15

[56] References Cited

U.S. PATENT DOCUMENTS

| | | | |
|---|---|---|---|
| 3,909,751 | 9/1975 | Tang et al. | 307/320 X |
| 4,075,650 | 2/1978 | Calviello | 357/15 |
| 4,594,557 | 6/1986 | Shillady | 307/320 X |
| 4,745,445 | 5/1988 | Mun et al. | 357/15 |

OTHER PUBLICATIONS

Pengelly, *Microwave Field-Effect Transistors-Theory, Design and Applications,* Research Studies Press (John Wiley & Sons), N.Y. 1982, p. 420.
Landauer, R., *Jour of Applies Physics* (1960) 31:479–484 "Parametric Amplification along Nonlinear Transmission Lines".
Landauer, R., *IBM Journal* (1960) "Shock Waves in Nonlinear Transmission Lines and Their Effect on Parametric Amplification" pp. 391–401.
Khokhlov, R. V., *Radiotekhnika i elektronika* (1961) 6: 77–89 "On the Theory of Shock Radio Waves in Non-Linear Lines".
"Nonlinear Transmission Line for Picosecond Pulse Compression and Broadband Phase Modulation", *Electronics Letter* (1987) 23:109–110.
Jager, D. and Tegude, F., *Applied Physics* (1978) 15:393–397 "Nonlinear Wave Propagation along Periodic-Loaded Transmission Line".
Jager, D., *Int J Electronics* (1985) 58:649–668, "Characteristics of Travelling Waves Along the Non-Linear Transmission Lines for Monolithic Integrated Circuits: a Review".
"Gate Propagation Delay and Logic Timing of GaAs Integrated Circuits Measured by Electro-Optic Sampling" Electronics Letter (1986) 22:2 pages.

*Primary Examiner*—Paul Gensler
*Attorney, Agent, or Firm*—Ronald C. Fish

[57] ABSTRACT

There is disclosed herein a non linear transmission line comprised of a 50 ohm coplanar monolithic waveguide formed on top of a gallium arsenide substrate having a layer of lightly doped epitaxial gallium arsenide with a heavily doped buried layer, said epitaxial layer having spaced, electrically isolated islands. A self aligned Schottky diode junction is formed at the intersection of each isolation island with the center conductor of the transmission line. The second conductor of the transmission line is coupled through a contact window and an ohmic contact to the buried layer in each isolation island.

17 Claims, 6 Drawing Sheets

NONLINEAR TRANSMISSION LINE FOR GENERATION OF PICOSECOND ELECTRICAL TRANSIENTS

The U.S. government has a paid-up license in this invention and the right in limited circumstances to require the patent owner to license others on reasonable terms as provided for by the terms of contract No. N00014-85K-0381 awarded by the Department of the Navy.

BACKGROUND OF THE INVENTION

The invention relates to the field of generation of electrical signal transitions with very short fall times in the picosecond and subpicosecond range. More specifically, the invention relates to the field of compression of the fall time of an input step function to generate an output step function which has a fall time measured in picoseconds or fractions of picoseconds.

The development of advanced high-speed digital devices and integrated circuits has been spurred by a number of applications, including fiber optic digital data transmission at gigahertz rates, high-throughput computing and wide-band signal processing. Military interest in high-speed digital electronics stems from the need in electronic warfare systems to rapidly acquire, digitize and process very large amounts of data. Associated with the needs for high-speed logic are commensurate demands for broad-band analog signal processing, interface and input/output electronics, including correlators, and broad-band adaptive filters, picosecond-resolution sample-and-hold gates, and multi-gigahertz rate D/A and A/D converters. Time-domain electronic instrumentation of comparable speed will be required for the development of these components.

The primitive circuit functions for ultrafast analog/digital interface systems include sampling gates for acquisition of repetitive waveforms in measurement systems, sample-and-hold circuits as preprocessors for A/D converters, comparators, D/A and A/D converters, and picosecond pulse generators serving as the strobes for these circuits. To build such circuitry, it is necessary to be able to achieve pulse widths, aperture times, settling times and loaded-gate propagation delays on the order of from 1 to 10 picoseconds.

To attain switching speeds in the range of from 1 to 10 picoseconds, where both device and interconnection parasitics become important, novel circuit topologies incorporating microwave design methodology must be developed. State-of-the-art digital electronics and broad-band/pulsed analog electronic currently available both exhibit switching speeds and rise times on the order of 50 picoseconds which is equivalent to a bandwidth of approximately 8 Ghz.

The ability to generate signals having very short fall times is very useful. Such signals may be differentiated to generate pulses having very narrow pulse widths, and these pulses may be used to gate diode sampling bridges used in certain signal processing equipment such as sampling oscilloscopes to do wide-bandwidth time-domain electronic measurements. Such short pulses are also useful in other waveform sampling devices and devices to do picosecond metrology as well as in the applications mentioned previously herein. In general, picosecond pulse generators are central components in highspeed analog applications and in high performance digital systems.

In the prior art, step recovery diodes have been used to generate 10 volt transitions of approximately 35 picosecond rise times for use in gating diode sampling bridges For purposes of discussion the term "rise time" will be considered equivalent to the term "fall time". Tunnel diodes have also been used to generate short pulses, and step functions or transitions. These pulses have been used as the test pulse in time domain reflectometers. These tunnel diodes generate transitions of 0.2 volts having 25 picosecond rise times.

Sampling oscilloscopes have used step recovery diodes for gating the diode sampling bridges therein since the early sixties. The performance of these oscilloscopes has not improved significantly since circa 1966–1968. In 1987, some new sampling oscilloscopes were introduced having 20 Ghz bandwidth. However, the earlier sampling oscilloscopes of 1970 vintage had a bandwidth of 18 Ghz, so the new oscilloscopes did not represent a major improvement over the older models.

Thus, a need has long existed for a device which can generate signals which have fall times in the range of from 1 to 10 picoseconds. These transitions can be used to generate very short pulses to trigger diode-sampling bridges and for many other purposes.

The elements to construct such an apparatus have been available in the prior art for many years. For example, nonlinear transmission lines have been available for approximately 30 years, it has long been known that fast electrical transients can be generated by nonlinear wave propagation on such nonlinear transmission lines through the formation of "shock waves". The meaning of this term will become clear from the following discussion. In an article entitled "Parametric Amplification along Nonlinear Transmission Lines" by Rolf Landauer published in the Journal of Applied Physics, Volume 31, Number 3, March 1960 at pages 479–483, distributed, nonlinear capacitances along a dispersionless transmission line were taught as a possible structure to provide parametric amplification. The structure he proposed was a ferroelectric crystal with thin metallic strips evaporated on its surfaces, serving as electrodes. He noted that such crystals at temperatures just above the transition at which the spontaneous polarization disappears are strongly nonlinear capacitances. Landauer also taught that the speed of a given part of a wave propagating down such a transmission line depends upon the voltage. This results in a distortion of the wave shape. This occurs because portions of each wave which are associated with the smallest values of differential capacitance will be the fastest. This causes these portions to tend to catch up with preceding slower portions and to simultaneously move away from slower portions of the wave that follow. Landauer taught that for a transmission line where $dQ/dV$ is a monotonically decreasing function of voltage, a pulse having a Gaussian shape at the input will emerge with a distorted shape with the leading edge having a faster fall time than the signal which was input to the line. He also noted that eventually this pulse-shaped distortion will result in a wave which has a front with infinite slope. This process results in what are called "shock waves". In a later article published in the *IBM Journal* of October 1960, entitled "Shock Waves in Nonlinear Transmission Lines and Their Effect on Parametric Amplification" at pages 391–401, Landauer noted that the deformation process in a nonlinear transmission line is of some interest as a method of harmonic generation and as a method by which one end of a pulse can be sharpened at the expense of the other. This paper taught that as periodic signals are propagated along a transmission line with a nonlinearity in the distributed capacitance, the signal is deformed and electromagnetic shock waves formed. The paper teaches that these shock waves will form in a distance which is too short for any parametric amplification purpose. The paper concludes that parametric amplification cannot be achieved on transmission lines which are relatively dispersionless with nonlinear wave propagation properties that cause the formation of such shock waves. However, the paper does teach that wave shaping, harmonic generation and intermittent amplification accompanied by a signal compression are possible with such a system. Thus it has been known since at least 1960 that nonlinear transmission lines create changes in the input-pulse shape which can be used for wave shaping.

Other workers in the art have also investigated the generation of shock waves on nonlinear transmission lines. In a paper entitled "On the Theory of Shock Radio Waves in Nonlinear Lines", published in 1961 by Khokhlov in *Radio Tekhnika i Elektronika,* No. 6 at pp. 917-925, an analysis was given of the process of propagation of waves in weakly nonlinear and weakly absorbing media having no dispersion property. This paper referenced the work of Landauer and investigated propagation in a line where the nonlinear parameter was the distributed capacitance. The influence of attenuation on the formation and blurring of the shock wave front was analyzed, and the possibility of using such a line for a generator of harmonics and sawtooth voltages was presented. The influence of the series resistance in such a line was also analyzed. The paper concluded that the propagation of radio waves along a weakly absorbing line with nonlinear distributed capacitance causes the shape of the wave to be distorted and discontinuous. Eventually, the wave is gradually transformed into a sawtooth wave which is independent of the form of the input periodic voltage. Thus, the possibility of changing a wave shape by propagation of a signal down a nonlinear transmission line was again recognized in the prior art by a different worker than recognized this property the first time who noted the first workers findings and studied the subject in more detail.

Other workers in the art have proposed high frequency transmission lines which are periodically loaded with varactor diodes for the study of nonlinear wave propagation. "Nonlinear Wave Propagation Along Periodic Loaded Transmission Line" published by D. Jager and F. J. TeGude in *Applied Physics* Vol. 15, pp. 393-397 (1978) taught the transition capacitance of the PN junction of varactor diodes can be used to cause nonlinearity of wave propagation in a transmission line. This results from the fact that the capacitance of any particular section depends upon the voltage across the transmission line at that point. This paper focused not on wave shaping or compression of fall times but on harmonic frequency generation along a nonlinear transmission line. It concluded that second harmonic generation can be reached under certain circumstances.

In a later paper entitled "Characteristics of Traveling Waves Along the Nonlinear Transmission Lines for Monolithic Integrated Circuits: A Review" published in the *Int'l Journal of Electronics,* Vol. 58, No. 4 at pages 649-669 (1985), D. Jager taught a structure for a nonlinear transmission line using spatial periodicity. This spatial periodicity was implemented in the form of periodic loading of the line by Schottky diodes. This paper taught the use of in coplanar waveguides on layered semiconducting substrates. The paper proposes a structure for a Schottky microstrip line which is periodically loaded with diodes where approximately half the length of the line is consumed by diode active areas. FIG. 2 of this paper shows periodic, slow-wave propagation structures which are somewhat similar to the structure of the invention but which differ in several significant aspects. First there is no buried N+ layer of heavily doped semiconductor to reduce the diode series resistance. Second, there are apparently no ohmic contacts between the ground plane conductors and the doped semiconductor in the diode isolation island. Also, the pitch in center to center spacing appears to be higher than in the invention. If this is true, it would result in much more of the transmission line total area being consumed by diode junction area. This would result in much higher total capacitance, and in a characteristic impedance which is lower than the industry standard of 50 ohms. The paper concludes that the proposed slow-wave structures having the nonlinearity arising from the voltage dependence of the depletion layer width in the semiconducting substrate are the most promising devices for nonlinear wave applications. However, the paper also concludes that a central drawback limiting the usefulness of these structures exists in the attenuation of the wave during propagation. The paper notes that these losses must be minimized for any practical design. Generally speaking, this paper is focused upon the slowwave propagation characteristics of these lines and does not focus upon the possibilities of wave shaping or compression of fall times using such structures.

It has been known since at least 1966 that the speed at which the diode-sampling bridge in a sampling oscilloscope can be gated is the limiting factor on the bandwidth of such a device. However, the structure of the invention to solve this problem has not been previously disclosed in the prior art despite the fact that the various elements needed to make the structure and the basic theory of operation of the structure have long been known. Most, if not all, the structures and process steps needed to make the structure of the invention such as varactors, nonlinear transmission lines, heavily and lightly doped semiconductor layers, and ohmic contacts and epitaxial methods have been known in the prior art for quite some time. Thus, although the need for picosecond pulses has existed since the sixties and the tools to make a structure to fill this need have existed since the sixties and seventies, nothing in the prior art before this invention existed to fill the need. Basically this need is for a device which can compress the fall time of an input signal to somewhere in the range from 1 to 10 picoseconds and which has a characteristic impedance of approximately 50 ohms such that the device may be coupled to other transmission lines having the industry standard characteristic impedance of 50 ohms with good power transfer characteristics at the coupling. In some embodiments, it may be possible to compress the input fall time to the subpicosecond range.

SUMMARY OF THE INVENTION

According to the teachings of the invention, there is disclosed a nonlinear transmission line which can generate picosecond electrical transients by shock wave formation on a gallium arsenide monolithic substrate. Output fall times on the order of 7.8 picoseconds have been generated by a single such transmission line driven at 15 Ghz with a 20 picosecond input fall time. The transmission line is comprised of 2 metallic ground plane conductors which are parallel and which run the length of a gallium arsenide substrate. The substrate has formed on the top surface thereof an N+ doped epitaxial layer. An N− doped epitaxial layer is formed on top of the N+ doped epitaxial layer. Spatial periodicity of the transmission line is implemented by the periodic formation of Schottky varactor diodes along the length of the transmission line by an isolation implant which formed spaced, electrically isolated active regions in the N− and N+ epitaxial layers. The transition capacitance of the junctions of these diodes varies with voltage and provides the nonlinearity of the transmission line. The voltage dependence of the transition capacitance results in a voltage dependent group velocity which causes the compression of fall times since the higher voltage points on the wave travel faster than the lower voltage points.

The varactor diodes are small enough in size that the overall capacitance of the line is low enough to insure that the characteristic impedance of the transmission line is maintained at approximately 50 ohms or any other selected impedance. Isolation implants into the epitaxial layers immobilize the charge carriers in the field everywhere but where the diodes are to be formed. These implants along with the width of the transmission line center metal contact define the diode junction area. These implants also define the pitch of these Schottky diodes. The intersection of the isolation implants with the center metal contact of the transmission line define the Schottky diode junction area in self-aligned fashion.

The ground plane conductors make contact with the N+ layer via ohmic contacts formed at the bottom of contact holes which have been etched through the N− epitaxial layer.

The presence of the N+ layer reduces the series resistance of the varactor diodes thereby increasing the diode cutoff frequency. Use of ohmic contacts also helps reduce the series resistance of the diodes. The use of distributed, small-size capacitors which vary in capacitance with the instantaneous voltage level on the line at that point keeps the characteristic impedance of the line close to, the industry standard impedance of 50 ohms or some other selected impedance and causes the desired nonlinear propagation. The 50 ohm characteristic impedance allows the device to be used with other industry standard components with efficient power transfer to and from these devices.

In alternative embodiments, the spacing and size of the varactor diodes can be altered along the length of the transmission line. This may be done to take into account the fact that as the fall time of the input signal is compressed during propagation along the line, the high frequency components in the spectrum of the signal increase. Therefore, smaller diodes with higher cutoff frequencies are desirable at locations further down the line from the input. To maintain the characteristic impedance near 50 ohms or the desired impedance as the diode junction area gets smaller, the spacing between the diodes is also decreased to reduce the inductance per section. This maintains the relative ratio between the characteristic inductance and the characteristic capacitance per section of the line thereby maintaining the characteristic impedance at a constant level of near 50 ohms or the desired impedance.

The process of fabrication according to the teachings of the invention involves epitaxially growing the N+ layer and the N− layers on top of an undoped gallium arsenide substrate. In the preferred embodiment, the doping of the N+ layer is heavy and uniform, the doping of the N− layer is light and uniform from the surface of the transmission line where the metal contacts are formed to the junction with the N+ layer. In alternative embodiments, the doping of the N− layer may be varied such that a lower concentration of impurities exists near the junction of the N− layer and the N+ layer than exists at the surface in contact with the metal lines. This doping profile is such that the variation of the depletion layer width with changes in voltage is linear throughout the range of voltage change of the input signal. Also, hyperabrupt Schottky junctions allow the capacitance to change by a larger amount per unit change in voltage allowing more compression per unit length of line. After the epitaxial layers are formed, contact holes are etched through the N− layer and the various layers of the ohmic contact alloy are deposited in electrical contact with the N+ buried layer. The ohmic contacts are then formed by a high temperature rapid thermal anneal step. Next, a liftoff process using positive photoresist is used to form a metal mask (gold) over a polyimide layer in contact with the substrate in a pattern to define where the Schottky diodes are to be formed. Then protons or other ions are implanted in a two-step implant process to cause crystal damage in the doped epitaxial layers at all locations where Schottky diodes are not to be formed. This crystal damage traps the mobile charge carriers in the epitaxial layers at all locations outside the isolation islands of the Schottky diodes. The metal mask is then removed.

After the isolation implant or implants, the Schottky metal contact of the transmission line center conductor is formed by evaporation deposit of titanium. Platinum is deposited on top of the titanium as a diffusion barrier to prevent the gold which will be deposited on top of the platinum from diffusing into the titanium or the N− layer below it. The platinum layer is then covered with a gold layer which is also evaporated to a large thickness to increase the total conductor cross sectional area and decrease the series resistance. This center conductor is then completed by a liftoff step to remove the remaining photoresist and the metal lying on top of the photoresist. In some embodiments, the gold metallization of the transmission line conductors and the ground plane contacts is completed during formation of the center contacts using liftoff photolithography, and in other embodiments, this may be a separate step using either liftoff techniques or subtractive etching done in conjunction with electroplating. The structure is then completed except for packaging by conventional methods.

DETAILED DESCRIPTION OF THE PREFERRED EMBODIMENT

Figure 1:
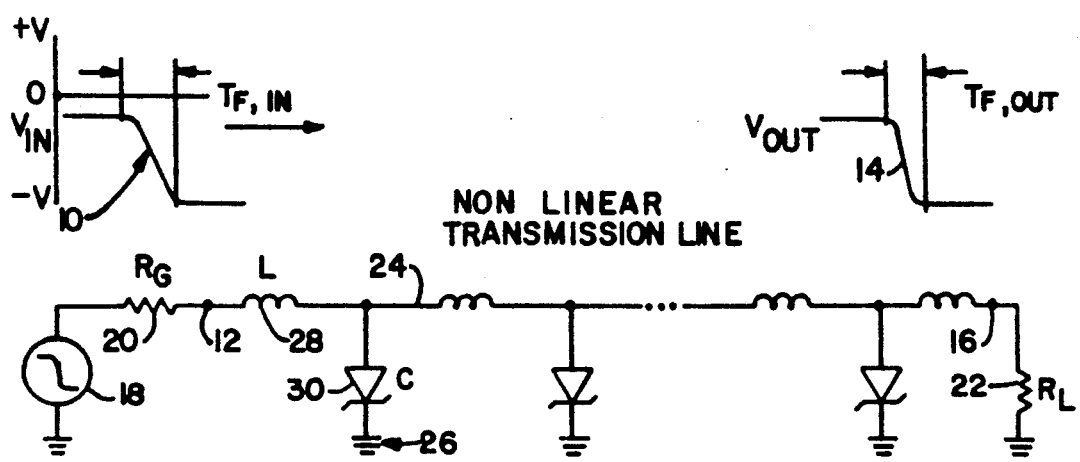
FIG. 1 is schematic diagram of a nonlinear transmission line.

Referring to FIG. 1 there is shown a schematic diagram of a nonlinear transmission line. This transmission line will change the shape of an input signal shown generally at 10 and applied to an input terminal 12 to the output signal shown at 14 appearing at an output terminal 16. In the process of propagating from the input terminal 12 to the output terminal 16, the fall time of the signal 10 is reduced from the time $T_{f,in}$ to the fall time of the output signal equal to $T_{f,out}$. The input signal 10 is supplied by a signal generator 18 through a source resistance 20. The output signal 14 is applied to a load resistance 22.

The nonlinear transmission line between input terminal 12 and output terminal 16 is comprised of a plurality of segments. Each segment is comprised of an inductor L and a capacitor C. In the preferred embodiment, the inductance is implemented through short sections of transmission line marked XX in FIG. 4. These short sections of transmission line have a characteristic impedance $Z_1$ and have a length in units of time which is designated in the equations of Appendix A as the Greek letter tau. Each capacitor takes the form of a varactor diode junction in the preferred embodiment. The capacitor in each section couples the center conductor 24 of the transmission line to a ground plane shown generally at 26. Thus, the first section of the nonlinear transmission line of FIG. 1 is comprised of the inductor 28 and the varactor diode 30 having its anode coupled to the conductor 24 and having its cathode coupled to the ground plane 26. The conductor 24 serves as the center conductor. The varactor diode 30 has a PN junction therein which has a transition capacitance. The transition capacitance results when the junction is reverse biased and a depletion region is formed as will be explained in more detail below. The transition capacitance is actually the change in uncovered charges of the depletion region as the voltage changes, but for discussion purposes the reader can visualize the capacitor as having two movable, conductive plates. These two conductive "plates" are separated by the depletion region when the diode junction is reversed biased. For completeness here, the transition capacitance and depletion region will be explained briefly so that the nonlinearity of the transmission line can be understood by the reader. To do this requires reference to a cross section of the diode region.

Figure 2:
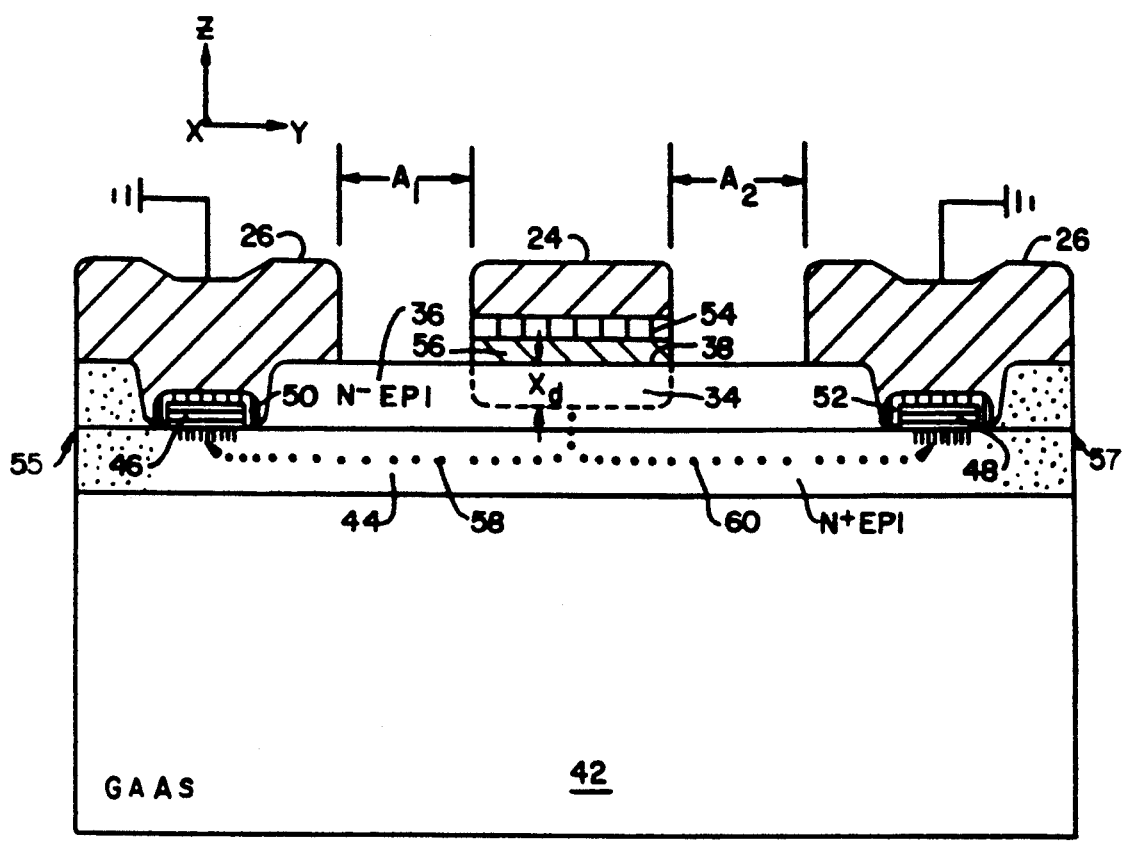
FIG. 2 is a cross sectional view of the structure of a nonlinear transmission line according to the teachings of the invention taken through a diode isolation island.

Referring to FIG. 2 there is shown a cross section of the transmission line at a location which shows the construction of one of the varactor diodes according to one embodiment of the invention. FIG. 2 will be explained in much greater detail below during the discussion of the features of the transmission line. For now, the reader's attention is directed to a Schottky contact (diode junction) 38, a depletion region 34 and a $N^-$ doped epitaxial layer 36 and an $N^+$ doped epitaxial layer 44. These three components along with ohmic contacts 46 and 48 form a Schottky diode. The dotted line defining the bounds of the depletion region 34 represents the extent of the depletion region into the $N^-$ epitaxial layer 36 at a particular voltage level of reverse-bias on the Schottky diode junction. This depletion region 34 represents a volume of uncovered, immobile charges bonded in the $N^-$ epitaxial gallium arsenide crystal lattice caused by the reverse-bias voltage. That is, the reverse-bias voltage causes mobile majority carriers donated by the dopants in the $N^-$ epitaxial layer 36 to move away from the junction 38. In $N^-$ material, these majority carriers are free electrons that are loosely bound to the nuclei of the N-type impurity atoms which have been added to the crystal lattice. When these mobile carriers move away from their nuclei under the influence of the negative potential applied to the anode of the diode, they leave uncovered the nuclei of the dopant atoms. These dopant atoms have one more proton than electron because of the movement of the electrons away from the junction, and thus represent immobile positive charges making up the depletion region 34. The dimension $x_d$ represents the depletion region width. This dimension increases with increased reverse-bias voltage. Schottky contact 38 is the anode of the diode, and the $N^-$ epitaxial layer 36 is the cathode of the diode. When a negative voltage is applied to the anode relative to the cathode, the diode is reverse-biased and the depletion region 34 is formed. If the level of reverse-bias voltage is increased, the dimension $x_d$ increases as more electrons are pushed away from the junction and more positive charges are uncovered. This process of uncovering charges represents the process of changing charge storage as voltage changes, which is the essence of a capacitor. This increase in uncovered charge with increases in applied voltage may be considered to be a capacitive effect. This capacitance is the transition capacitance which will hereafter be denoted $C_j(v)$. The magnitude of the transition capacitance is equal to the change in charge within the depletion region divided by the change in voltage which caused that change in charge. This capacitance is variously referred to in the literature as the transition region, space charge region, barrier region or depletion region capacitance. Because the depth of the depletion region 34 increases as V becomes more negative, the transition capacitance decreases with more negative voltages V.

The amount of change in the dimension $x_d$ with the change in reverse-bias voltage depends upon the doping of the $N^-$ epitaxial layer 36. Lighter doping leads to greater changes in the width of the depletion region for a given change in the reverse-bias voltage.

Referring again to FIG. 1, what this change in the transition capacitance means in terms of the operation of the nonlinear transmission line is as follows. As the input signal 10 propagates along the transmission line, the instantaneous voltage at the anode of each diode changes over time. The input signal is applied with such a polarity relative to ground, that all diodes are reverse-biased. As the reverse-bias voltage on each anode changes, so does the transition capacitance magnitude. There is a total capacitance per section of line which is the combination of a fixed capacitance from the interconnecting line sections XX in FIG. 4 which is not voltage dependent and the transition capacitance which is voltage dependent. Thus, the total capacitance per section of line is voltage dependent.

Many characteristics of the transmission line depend upon the transmission line capacitance per section. Where the capacitance per section is voltage dependent, so are these parameters. For example, the characteristic impedance of the line, the group delay and the group velocity of the line are all voltage dependent.

Precisely speaking, the mathematical relationship between the characteristic impedance and the voltagedependent total capacitance per section of the line (denoted $C_T(v)$) is given in Equation 1 of Appendix A. The relationship between the group delay and the voltage dependent total capacitance per section of line is given in Equation 5 of Appendix A. The other equations of Appendix A define various other relationships of interest in considering the characteristics of a nonlinear transmission line. Equation 4 of Appendix A defines the precise mathematical relationship between the capacitance of a step junction diode and the voltage applied to that junction to reverse bias it. Equations 6 and 7 of Appendix A give the relationships between the periodic structure cutoff frequency $w_{per}$ and the diode cutoff frequency $w_{rc}$ and the voltage dependent capacitance per section, the line inductance per section and the series resistance of the diodes. Generally, the higher these cutoff frequencies are, the shorter the falltime which can be achieved at the output of the line.

Figure 3A:
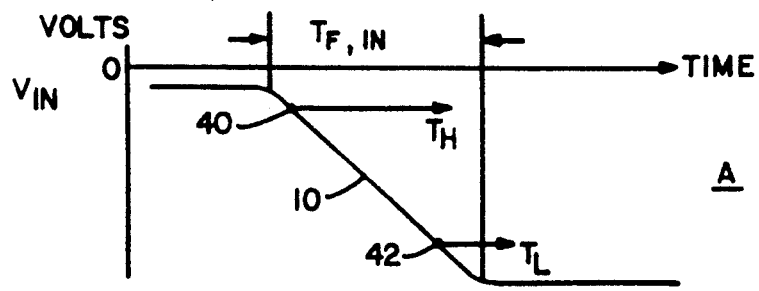
FIGS. 3A and 3B are diagrams of, respectively, the input signal and the output signal from the nonlinear transmission line of the invention showing the results of the compression.
Figure 3B:
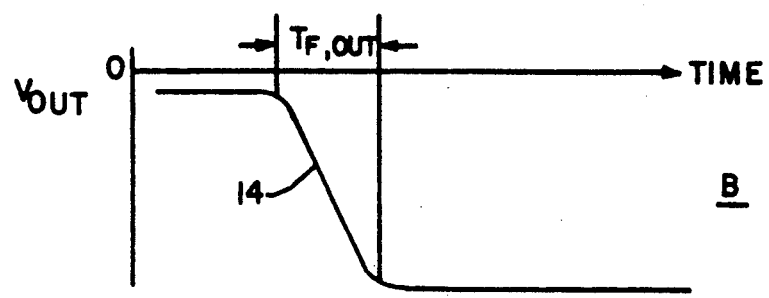

It is the voltage dependence of the group velocity which results in compression of the fall time of electrical wave fronts as they propagate along such a nonlinear transmission line. This compression can be understood by reference to FIGS. 3A and 3B. FIG. 3A shows the input signal 40 labeled $V_{IN}$ in part A and the output voltage labeled $V_{OUT}$ in part B. The fall time of the input signal is labeled $T_{f,in}$. The fall time of the output signal is labeled $T_{f,out}$. Note that the fall time of the output signal is substantially shorter than the fall time of the input signal because of the compression which occurred during propagation down the line. The reason for this compression is that the points on the input voltage waveform having more negative voltages travel at higher speeds and experience less delay in a nonlinear transmission line than points on the voltage waveform having more positive voltages. This is because of the voltage dependence of the line capacitance and the relationship between the line capacitance and the group delay. This phenomenon is symbolized in FIG. 3A by the delay vector labeled $T_H$ for the point 40 on the input voltage wave form being longer than the delay vector labeled $T_L$ for the point 42 which is lower on the voltage waveform. Every point on the voltage waveform has a different speed of propagation, and hence a different delay through the line. Because the higher voltage points are traveling faster and have less delay than the lower voltage points, the "tops catch up with the bottoms" and the waveform changes shape and assumes the shape of the output waveform known at FIG. 3B. The result is that the fall time is compressed as seen by the substantially shorter duration of $T_{f,out}$ in FIG. 3B, compared to $T_{f,in}$ in FIG. 3A. The reasons why higher voltage points have faster speeds of propagation are described in Appendix A and are well understood by those skilled in the art and no further details will be given here.

Figure 4:
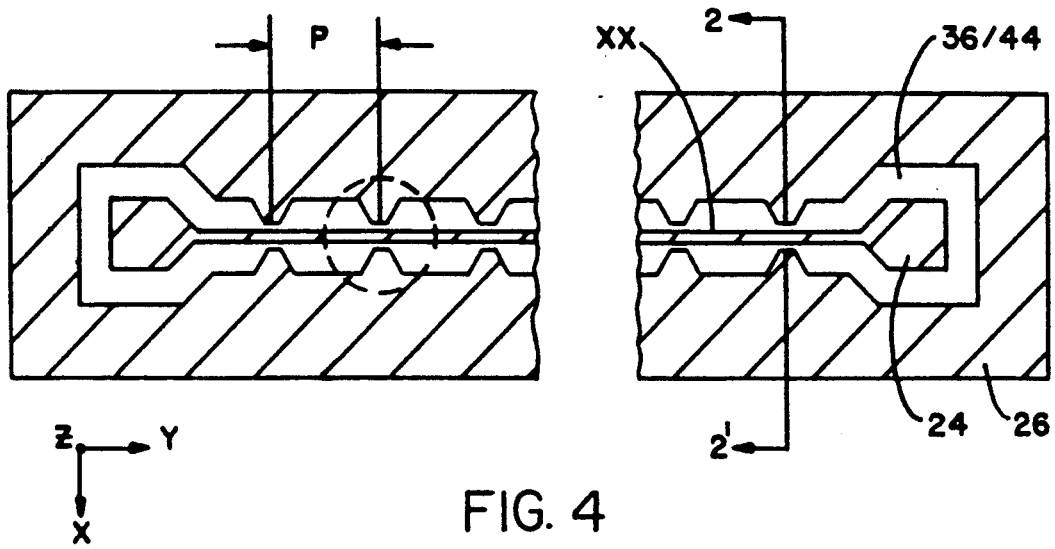
FIG. 4 is a plan view of the structure of the invention.

Referring to FIG. 4 there is shown a plan view of the nonlinear transmission line according to the preferred embodiment of the invention. The structural details of the transmission line can best be understood by joint reference to FIGS. 2, 4, 5 and 6. FIG. 2 shows a cross-section of one of the diodes in the transmission line taken at section line 2—2' in FIG. 4 according to one process of fabricating the line. The transmission line is fabricated on a monolithic gallium arsenide substrate 42. This substrate has formed thereon an N+ epitaxial layer 44 and an N− epitaxial layer 36 formed on top of the epitaxial layer 44. In FIG. 4, only a portion of these epitaxial layers is visible between the ground plane metal contacts 26 and the center metal contact 24. This epitaxial layer portion is labeled 36/44. The two parallel metal conductors 24 and 26 form the inductive portions of the transmission line. The center conductor 24 also forms the anode contact of the Schottky diodes. The ground plane contact 26 is also the cathode contact of the Schottky diodes. These cathode contacts are implemented with ohmic contacts to the N+ epitaxial layer 44 as best shown in FIG. 2.

The ohmic contacts 46 and 48 are formed by alloying a gold germanium mixture at high temperatures as is well known in the art. Any ohmic contact alloy will work to form the contacts 46 and 48, but it is preferred to use an alloy and a technique which will create the lowest possible contact resistance for reasons which will be explained more fully below. In the preferred embodiment, the ohmic contacts 46 and 48 are formed by heating a mixture of 8% gold and 12% germanium so as to cause the germanium to diffuse into the N+ epitaxial layer 44 to form a low resistance contact. The ground plane metal contact 26 and the center anode contact 24 are each comprised of gold. Two diffusion barrier layers 50 and 52 in the ohmic contact structure prevent the gold from the ground plane conductor 26 from diffusing into the ohmic contact regions 46 and 48 or the N+ epitaxial layer below it. This prevents spiking of gold through the N+ epitaxial layer 44 to the substrate 42. Preferably, the metal/dopant alloy chosen for the ohmic contacts will have as low a melting point as possible. Other nonalloyed contact structures may also be used if spiking of the gold through to the substrate 42 can be prevented. It is important, however, for the contact structure chosen to have a low series resistance so as to maintain the diode cutoff frequency as high as possible.

The diode-anode contacts are formed by the gold layer 24 on top of a platinum diffusion barrier 54. The platinum diffusion barrier separates the gold layer 24 from the Schottky contact metal 56 and prevents the gold layer 24 from spiking through the Schottky junction to the buried layer 44 and shorting the diode. The Schottky contact metal layer 56 is titanium in the preferred embodiment. However, many other metals may be used for the Schottky contact metal layer 56. Basically, any metal that will form a Schottky diode may be used. Such metals include aluminum, molybdenum, chromium and alloys such as molybdenum/aluminum and titanium/tungsten. The desired qualities for the metal layer 56 are that it exhibit good adhesion to the gallium arsenide substrate and that the diffusion of the metal into the gallium arsenide be low during high temperatures of operation or during subsequent processing steps. It is also desirable that the material chosen for metal 56 be stable in the sense that it should not change the leakage current through the diode with aging, changing temperature and so on. For further information, see page 271 of the text on gallium arsenide processing incorporated by reference herein.

The liftoff process for forming the diode anode contact 56/54/24 is well known in the art of semiconductor processing and is described in more detail at page 145 in "Gallium Arsenide Processing Techniques" incorporated by reference herein. For completeness here, a short summary of the process will be given. In the area where metal is to be placed on the substrate, a layer of photoresist which has been spun onto the wafer is exposed to light through a mask. All other areas are shaded by the mask. The layer of photoresist is then hardened at the surface by a chlorobenzene soak before being developed. This renders the surface farthest away from the gallium arsenide harder than the regions closer to the substrate. The layer of photoresist is then developed. Because the developer carries away material closer to the substrate faster than the harder material farther away from the substrate, the area of photoresist exposed to the light is carried away and forms a hole with inwardly tapered edges. Then the desired metal is evaporated onto the surface of the substrate in the hole in the photoresist and onto the surface of the photoresist itself. Thereafter, the photoresist is dissolved thereby carrying away the metal on top of the photoresist and leaving the metal in the hole in the photoresist layer attached to the substrate there. This process is used to form the diode anode contact, the final interconnect metallization, and the ohmic contacts. It is also used to form the implant mask except that a layer of polyimide is placed under the layer of photoresist such that the metal in the hole in the photoresist is formed on top of a layer of polyimide. After the metal liftoff, the metal in the hole lies on top of a layer of polyimide covering the whole wafer. The wafer is then immersed in commercially available polyimide solvent to dissolve all the polyimide except that portion of the layer under the metal. The resulting metal/polyimide sandwich acts as an implant mask during the proton isolation implant.

Other gate technologies could also be used to form the Schottky diode anode contact. Some of these other gate technologies may have reduced reliability over time when subjected to high temperatures.

The doping of the N− epitaxial layer 36 is $3 \times 10^{16}$ $N_D$ atos/cm$^3$. The doping of the N+ epitaxial layer in the preferred embodiment is $3 \times 10^{18}$ $N_D$ atoms/cm$^3$.

Figures 5, 6:
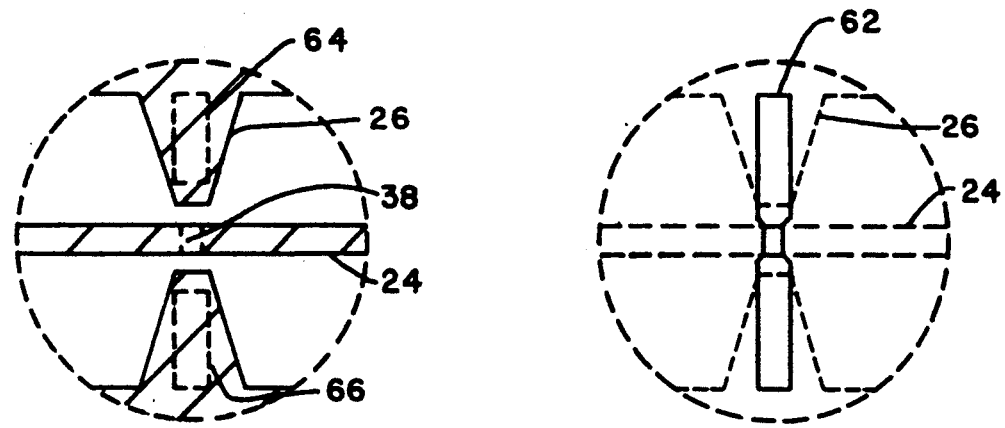
FIG. 5 is a plan view of the outline of the isolation implant mask.
FIG. 6 is a plan view of the diode, including diode contact region and ohmic contact regions.

The Schottky diodes are formed by isolating the epitaxial layers so that there are periodically spaced, isolated islands of epitaxial layers 36 and 44 which have mobile charge carriers therein. An implant is used at all other areas to cause crystal damage in the epitaxial layers 36 and 44 to immobilize the charge carriers, thereby converting the epitaxial layers in these implanted regions back to what is essentially intrinsic, high resistivity gallium arsenide. This crystal damage region is shown as the speckled pattern in the epitaxial layers 36 and 44 at 55 and 57 in FIG. 2. In FIG. 5 viewing above the plane of the nonlinear transmission line, the crystal damage region includes the entire area of the devices except for the masked regions 62 in FIG. 5 in which the diodes are formed. Outside the masked (unimplanted) regions 62, the implantation converts the N− and N+ layers into semi-insulating material, thus restricting the Schottky contact area 38 to within the unimplanted region 62. These isolation regions restrict the current path to the dotted lines shown passing through the N− epitaxial layer 36 and the N+ epitaxial layer 44 from the depletion region to the ohmic contacts. These current paths are designated 58 and 60 in FIG. 2.

A plan view of the boundary of the isolation island for each Schottky diode is illustrated in FIG. 5. In FIG. 5, the dashed lines represent the outline of the metal contacts 24 and 26, while the solid line 62 represents the boundary of the isolation implant. All area within the solid line 62 is not implanted. Thus, the charge carriers in the epitaxial layers 36 and 44 within this perimeter will be free to move.

Referring to FIG. 6 there is shown a plan view of the area of a typical diode. The dashed lines 64 and 66 define the perimeters of the ohmic contacts 46 and 48. The region 38 defined by the intersection of the areas of the central metal contact 24 and the isolation island 62 defines the junction area of the Schottky diode.

The dimension P in FIG. 4 defines the pitch or periodicity of the diodes. In the preferred embodiment, the pitch is 160 microns. Ten micron design rules are used in the preferred embodiment, which means that the junction area 38 in FIG. 6 of the diode is 10 microns $\times$ 10 microns. This also means that the space between the center conductor 24 and the ground plane conductors 26 is also 10 microns. Smaller junction areas and closer spacing will improve the performance of the device for reasons which will be explained in more detail below.

The minimum compressed fall time $T_{f,min}$ is set predominantly by the periodic line cutoff frequency and the varactor diode RC cutoff frequency $w_{rc}$. The expressions for these two cutoff frequencies are given by Equations 6 and 7 of Appendix A. With monolithic fabrication of the transmission line on gallium arsenide substrates, these two cutoff frequencies can be on the order of 0.1-1 terrahertz. This permits obtaining compressed fall times on the order of 5-10 picoseconds with 10 micron design rules. In the preferred embodiment, the integrated nonlinear transmission line incorporates 42 diodes. Each of these diodes has a junction potential phi of approximately 0.8 volts and $C_{jo}$ of approximately 50 femtofarads at 160 micron spacing (tau=1.4 picoseconds) along a 90 ohm coplanar waveguide transmission line. This results in a 140 gigahertz periodic line cutoff frequency. By calculation, the characteristic impedance $Z_o(v)$ varies from 44-55 ohms, and the group delay $T(v)$ changes by 25 picoseconds as the line voltage varies from 0 to −2 volts.

In FIG. 2, the N− epitaxial layer 36 is 0.6 microns thick in the Z direction. The N+ epitaxial layer 44 is 0.8 microns thick in the Z direction in the preferred embodiment.

The current in the diodes travels from the anodes to the cathodes along the paths 58 and 60 in FIG. 2. There is a series resistance associated with the current paths 58 and 60 which is the series resistance of the diode which limits the diode cutoff frequency $w_{rc}$. This series resistance can be divided into three components. The first component is the resistance of the current path in the portion of the N− epitaxial layer 36 from the bottom of the depletion region 34 to the junction with the N+ epitaxial layer 44. This component of resistance accounts for approximately 20% of the total series resistance, and varies as the depth of the depletion region 34 varies with voltage. The second component of the resistance is the component attributed to the flow of the current through the N+ epitaxial layer 44 to the positions of the ohmic contacts 46 and 48. This component accounts for approximately 60% of the total series resistance. The remaining 20% of the total series resistance is attributed to the resistance of the ohmic contacts 46 and 48. Obviously, closer spacing of the ground plane contacts 26 to the center contacts 24 will decrease the total path length and the total series resistance. Also, improvement of the ohmic contacts series resistance will raise the diode cutoff frequency.

The N+ epitaxial layer 44 also provides a resistive connection between the two coplanar waveguide ground planes labeled as metallic contacts 26 in FIG. 2. This resistive connection suppresses propagation of an undesired unbalanced "slot-line" mode on the transmission line.

Fabrication of the device of FIG. 2 is performed in the following manner. Fabrication starts with an undoped gallium arsenide substrate which has a sufficient length to get a sufficient number of sections of the transmission line to achieve the desired degree of compression. In the preferred embodiment, 42 diodes are used at 160 micron center to center spacing. The minimum number of diodes required in the line is approximately 20% larger than the quantity equal to the falltime of the input signal ($T_{f,in}$) divided by the difference in delay between the highest voltage point and the lowest voltage point of the waveform. This delay is given by Equation 5 of Appendix A. The factor of 20% is necessary because compression to the final, shortest falltime is approached asymptotically.

The first actual process step is to grow the two epitaxial layers 36 and 44. In the preferred embodiment, these layers are grown by molecular beam epitaxy to the thicknesses cited above. Any other epitaxial method will also work to grow these layers. For example, liquid or vapor phase epitaxy will work as well as MOCVD which stands for metal organic chemical vapor deposition. Methods of performing this process and other process steps described herein are described in more detail in "Gallium Arsenide Processing Techniques" by Ralph Williams, ISBN 0-89006-152-1 (Artech House, Inc. 1984) which is hereby incorporated by reference.

The epitaxial layers are doped as they are formed to have uniform doping profiles with the doping levels given herein. It is not believed that diffusion can be used to dope the epitaxial layers since it would not be possible to dope the epitaxial layer 44 heavily without leaving a doping level in the epitaxial layer 36 which is too high.

Next, the two ohmic contacts 46 and 48 are formed having 0.06 ohms/mm resistivity. These contacts are formed using a 0.75 um recessed etch, a self-aligned (88% gold-12% germanium)/nickel/gold liftoff technique, and a 450° C. alloy or a 12 second rapid thermal anneal. The rapid thermal anneal process is preferred since lower contact resistance can be achieved.

Figure 7:
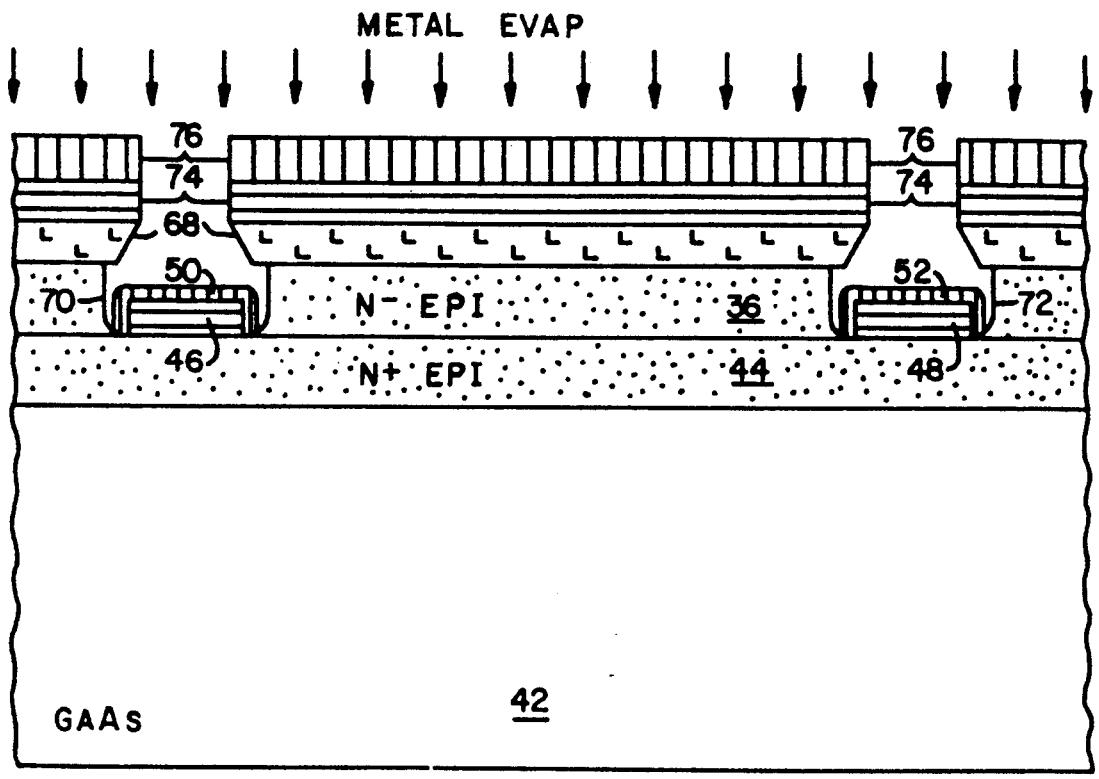
FIG. 7 is a cross sectional view of the structure during an intermediate stage of device construction during formation of the ohmic contacts.

FIG. 7 shows the state of the wafer after formation of the two epitaxial layers 36 and 44 and after deposition of the ohmic contact metals and just prior to the liftoff. The layer of photoresist 68 represents the configuration of the first mask level. The contact holes 70 and 72 are etched using the photoresist layer 68 as the etch mask. This etch is performed using a wet chemical etch because of the 10 micron design rules. If 2 micron design rules are used, in alternative embodiments, the etch step to form the contact hole 70 and 72 may be performed using a plasma etch. After the contact holes are etched through the N− epitaxial layer 36, a conventional metal evaporation step is performed. This metal evaporation step uses the photoresist layer 68 to protect all layers of the N− epitaxial layer 36 except the areas where the contact holes 70 and 72 are formed. To do this, the wafer is placed in a chamber which is pumped down to a high vacuum level. Then a high energy electron beam is directed at a crucible filled with a gold-germanium mixture comprised of the desired alloy. The electron beam evaporates portions of this mixture in the center of the crucible causing gold and germanium atoms in the prescribed proportion to be deposited as the first layer of the ohmic contacts labeled 46 and 48 in FIG. 7 and as the layer 74 on top of the photoresist layer 68. After this layer has been deposited, the gold-germanium target crucible is rotated out of the path of the electron beam and a crucible containing nickel is rotated into the path of the beam. The high energy electron beam then evaporates portions of the nickel in the target crucible causing nickel atoms to be deposited on top of the previously deposited gold-germanium layer. This nickel layer is labeled 50 and 52 in the positions of the ohmic contacts and 76 on top of the layer 74.

After these two metal layers are deposited, the photoresist layer 68 is dissolved in a chemical bath thereby removing the metal layer 74 and 76. In some embodiments, a further layer of gold (not shown) is evaporated on top of the nickel layers 50 and 52 prior to removal of the photoresist layer 68. In these embodiments, the photoresist layer 68 is removed after this gold layer is deposited. The entire structure then is subjected to a 450° C. alloy process in a diffusion furnace for 30 seconds or for 12 seconds in a rapid thermal anneal device. During this high temperature step, germanium atoms in the metal layers 46 and 48 diffuse into the N+ epitaxial layer 44, thereby forming a low resistance ohmic contact. During this high temperature step, the nickel layers 50 and 52 act as diffusion barriers to prevent gold deposited on top of the nickel from diffusing into the gold germanium layers 46 and 48. This also prevents the gold from diffusing into the epitaxial layer 44 and "spiking" through to the gallium arsenide substrate 42.

Figure 8:
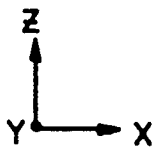
FIG. 8 is a cross sectional view of the structure of the device during the isolation implantation.
Figure 8:
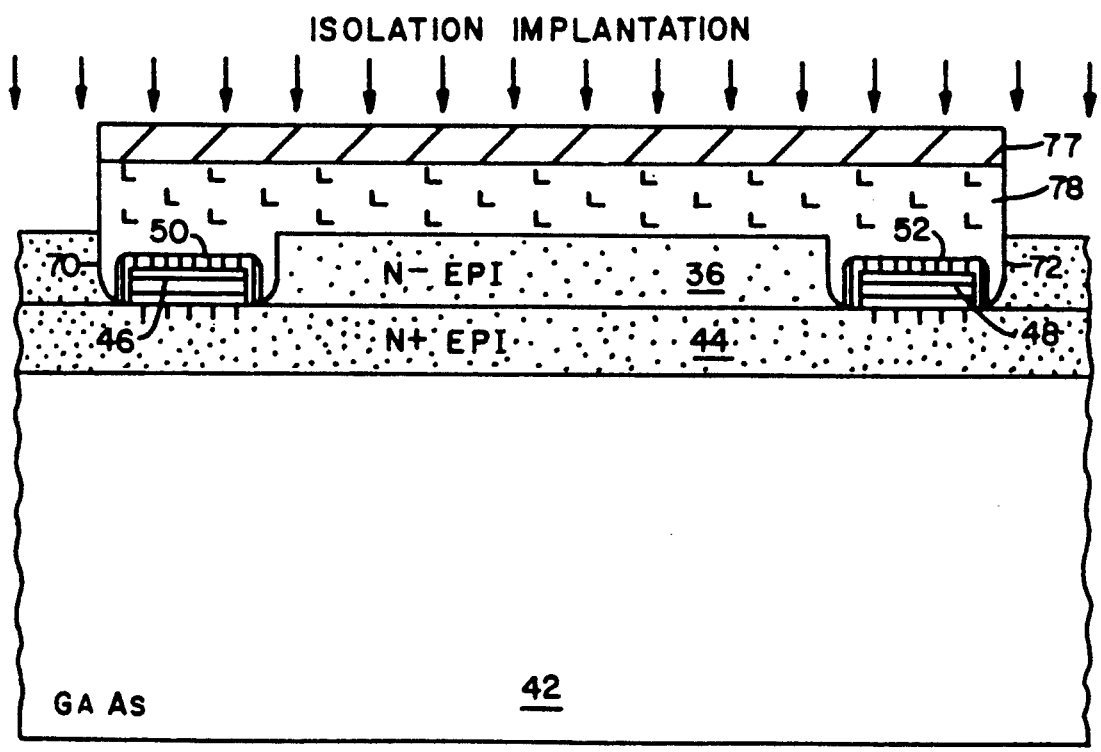

The next step is a proton implantation for the purpose of defining the isolation islands in which the Schottky diodes will be formed. FIG. 8 shows the proton implantation step and the configuration of the gold 77/ polyimide 78 implantation mask which defines the boundaries of the isolation island. The implantation mask 77/78 has a configuration from the plan view, i.e., looking down the Z axis, as shown in FIG. 5. The purpose of the isolation implantation has been previously described. Only the portions of the epitaxial layers 36 and 44 lying underneath the implantation mask 77/78 will be able to conduct current freely after the implantation step has been performed. In the preferred embodiment, the implantation is done using protons since protons are relatively easy to implant to the necessary depth into gallium-arsenide at energy levels around 190KEV. However, some equipment having greater acceleration energies is available to implant other types of ions such as oxygen or boron to the necessary depth. Any such implantation which causes the above described crystal damage result will suffice for purposes of practicing the invention. In the preferred embodiment, the proton implantation is done in two steps. The first step is an implant at 190KEV with a dosage level of $6 \times 10^{14}$/sq. cm. The second step is a 160KEV implant with a dosage level of $1.5 \times 10^{14}$/sq. cm. These implants provide a greater than 40 megohm/sq. isolation characteristic. The isolation mask 77/78 is comprised of 1.6 micrometers of gold shown at 77 and 1.4 micrometers of polyimide 78 overlying the ohmic contacts and the region 62 which will become the diode-active region.

The final process step is to perform a third mask level photolithography step to define by liftoff techniques the locations of the Schottky anode contacts 24 in FIG. 2 and the configuration of the ground plane metal contacts 26. After the resulting photoresist layer is developed, metal evaporation is used to deposit 0.1 microns of titanium as shown at 56 in FIG. 2. After the titanium is deposited, the titanium crucible is rotated out of the way and a platinum crucible is rotated into the target position. The high energy electron beam then is applied to evaporate a portion of the platinum in the center of the crucible to deposit a 0.1 micron platinum diffusion barrier shown at 54 in FIG. 2. Finally, the platinum crucible is rotated out of the way and a gold target crucible is rotated into the target position. The third evaporation step is then performed to deposit a 1.4 micron thick (Z direction) gold contact 24 and to form the gold ground plane contacts 26 and transmission line conductors 24. In some embodiments, the ground plane contacts 26 and transmission line conductors 24 may be formed separately with a fourth masking level. Schottky diodes are formed in a 10 micron by 10 micron region underlying the titanium layer 56 in each isolation island by the self aligned intersection of the titanium metal deposition and the isolation island. This completes the fabrication of the device.

With a nonlinear transmission line of the structure of FIGS. 2 and 4, it is possible to configure the dimensions of the structure to obtain compressed fall times which are short enough to generate gate impulses of approximately 5 picosecond duration or better. Such a gate impulse can be obtained by differentiating the output step transition after compression in a nonlinear transmission line of the structure of FIGS. 2 and 4. The band width of diode sampling bridges used in sampling oscilloscopes and network analyzers is primarily limited by the duration of the pulse gating the diode. With gating pulses having approximately 5 picoseconds duration, the bandwidth of 2 diode sampling bridges for sampling oscilloscopes could be extended from the current 20 gigahertz level to 100 gigahertz.

One of the factors which limits the shortest falltimes which are available from a nonlinear transmission line of the structure shown in FIGS. 2 and 4 is the cutoff frequency for the Schottky varactor diodes. This cutoff frequency, is defined by Equation 7 of Appendix A. Another factor which limits the amount of compression is the cutoff frequency of the periodic structure. This cutoff frequency is defined by Equation 6 of Appendix A. With the configuration of the nonlinear transmission line of FIGS. 2 and 4 and with some scaling of the structural dimensions using more stringent design rules, it is possible to obtain step functions with the falltimes of approximately 4 picoseconds. This is a factor of 6 improvement over the rise times which can be currently attained by electrical means. With further improvements in the process and with tighter design rules, it is possible to obtain subpicosecond rise times.

What is the relationship between the physical dimensions of the structure shown in FIGS. 2 and 4 to the amount of compression which can be obtained? As a step input signal $V_{in}(t)$ with initial voltage $v_h$, final voltage $v_1$, and fall time $T_{f,in}$ propagates along the line, the fall time will at first decrease linearly with distance. As the pulse fall time decreases, dispersion arising from the structures cutoff frequency, $w_c$, competes with the compression arising from the voltagedependent propagation velocity. A final limited fall time $T_{f,min}$, on the order of, but longer than $2.2/w_c$, is reached at which the edge compression per section due to line nonlinearity is equal to the edge broadening per section due to line dispersion. The output fall time is given by Equation 8 of Appendix A. $T_{f,min}$ in Equation 8 varies inversely with both the diode cutoff frequency $w_{rc}$ given by Equation 7 and the periodic cutoff frequency $w_{per}$ given by Equation 6. Exact calculation of $T_{f,\ min}$ requires computer simulation.

Line periodicity of the diode structure introduces a cutoff frequency $w_{per}$ which is given by the implicit relationship of Equation 9 of Appendix A which is simplified to Equation 6 of Appendix A. The term $C_{ls}$ in Equation 9 is the varactor's large signal capacitance and is defined by Equation 10 of Appendix A.

For input signals $V_{in}(t)$ such that at all points on the line the propagating wave is of sufficiently long rise time, the output of the transmission line is given by Equation 11 of Appendix A. This equation shows that the compression occurs because of the voltage dependence of the propagation velocity signal along the line as shown by the relationship between equations 11 and 5.

The performance of the line can be improved by increasing the periodic cutoff frequency $w_{per}$. This can be done by decreasing the diode spacing (in units of tau). However, decreasing tau (decreasing pitch) will also decrease the small signal characteristic impedance given by Equation 1 of Appendix A and will also decrease the large signal characteristic impedance given by Equation 12 of Appendix A because of the decrease in inductance per section (given by Equation 1 of Appendix A) where the characteristic impedance of the line is defined by Equation 12 of Appendix A. This is an undesirable result for the power transfer efficiency reasons noted above. Therefore, the large signal characteristic impedance $Z_{ls}$ given by Equation 12 in Appendix A will be constrained to approximately 50 ohms for purposes of practicing the invention. Other embodiments according to the teachings of the invention may use different characteristic impedances for specific applications. However, the preferred embodiment will have a characteristic impedance of approximately 50 ohms. Accordingly, to satisfy this constraint while decreasing the diode spacing tau, the large signal varactor capacitance $C_{ls}$ must also be scaled in proportion with the scaling of L, the transmission line inductance per section. In such a case, the periodic cutoff frequency $w_{per}$ is limited by lithographic constraints on the minimum junction area for the varactor.

The varactor series resistance $r_s$ introduces a varactor cutoff frequency of $w_{rc}$. If this cutoff frequency is much less than the periodic cutoff frequency $w_{per}$, this varactor cutoff frequency limits the compressed rise time to approximately $2.2\, r_s C_{ls}$. This time constant is the fundamental limitation to the compressed fall time, assuming elimination of the periodic line cutoff frequency $w_{per}$. Of course, neither cutoff frequency can be eliminated in reality so both effects must be taken into account.

The total circuit area of the structure shown in FIGS. 2 and 4 with 10 micron design rules and 160 micron diode spacing along a 90 ohm coplanar wave guide transmission line is approximately 8 mm by 0.3 mm. With a periodic line cutoff frequency of approximately 140 gigahertz, the minimum compressed fall time of 4 pico seconds can be obtained if the diode resistance is zero. With 10 ohm diode resistance, minimum compressed falltimes of 7.5 picoseconds can be obtained.

To generate subpicosecond pulses with a nonlinear transmission line, both the line periodicity cutoff frequency $w_{per}$ and the varactor cutoff frequency $w_{rc}$ must be increased. Because of the constraints on line impedance in the preferred embodiment of 50 ohms or thereabouts, diode spacing (L) must scale with diode junction area ($C_{j(v)}$). To decrease the diode capacitance and increase $w_{per}$, either the device-active layer doping must be decreased below $3 \times 10^{16}$ atoms/cm$^3$ or the junction area must be decreased below the 10 micron by 10 micron area described herein. Because of degraded diode cutoff frequency and because of rapid increases in the depletion layer width, $x_d$ in FIG. 2, with decreases in the doping of the N$^-$ epitaxial layer 36 requiring much thicker N-layers to avoid possible punch through, capacitance reduction through reduction in the junction area is the more desirable of the two approaches.

Increased varactor cutoff frequency $w_{rc}$ can be achieved by decreasing diode series resistance $r_s$. This can be achieved by reducing the spacing of the ohmic and Schottky contacts. In FIG. 2, decreased contact spacing would translate to smaller dimensions $A_1$ and $A_2$. This would decrease the length of the current paths 58 and 60 thereby reducing the series resistance. Further improvements in the series resistance can be made by selecting the ohmic contact material in process so as to minimize the series resistance presented by the ohmic contacts 46 and 48, by heavier doping of the N$^+$ epitaxial layer 44, and by optimization of the thickness of the N$^-$ epitaxial layer 36 to the maximum possible depletion layer width $x_d$. That is, the thickness of the epitaxial layer 36 should be made as close as possible to the maximum penetration of the depletion layer 34 into the N$^-$ epitaxial layer 36. This minimizes the current path segment from the edge of the depletion layer 34 to the junction between the epitaxial layer 36 and the epitaxial layer 44.

Figure 9:
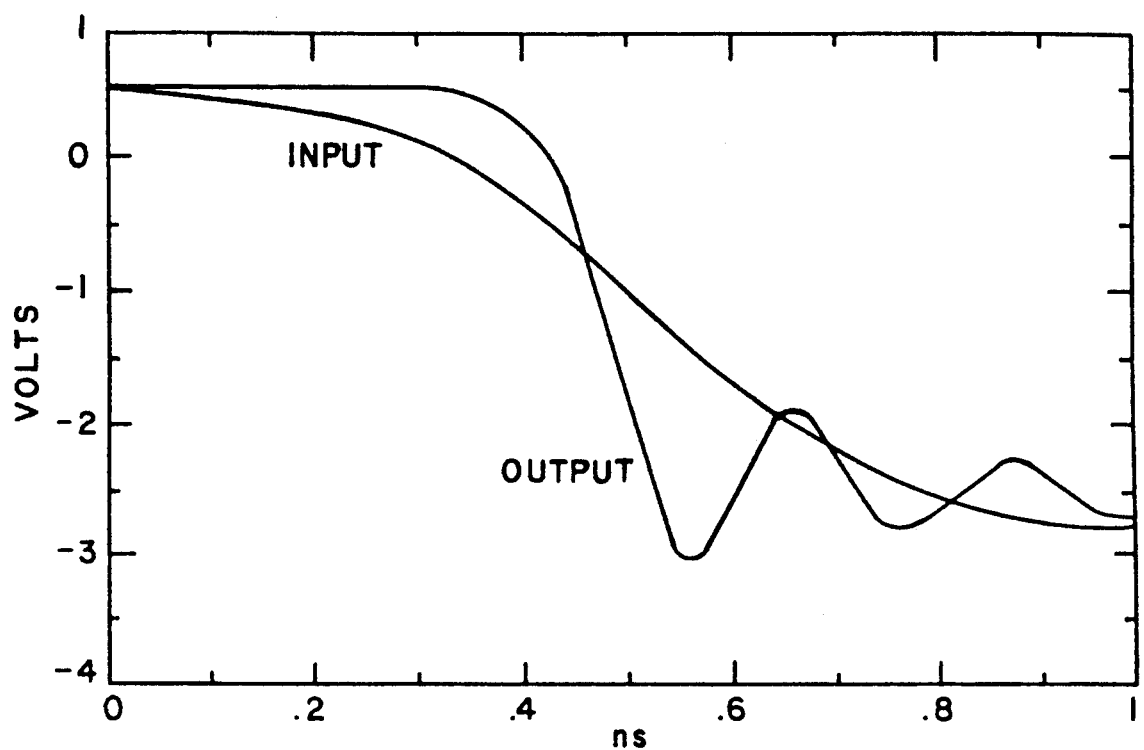
FIG. 9 is a diagram of the relative wave shapes of the input and output signals from the transmission line according to the teachings of the invention as implemented in a scale model of the preferred embodiment.

FIG. 9 is a graph of the compression of a 500 picosecond input fall time to a 100 picosecond output fall time on a scale model of the invention which was constructed with very large geometries.

Figure 10:
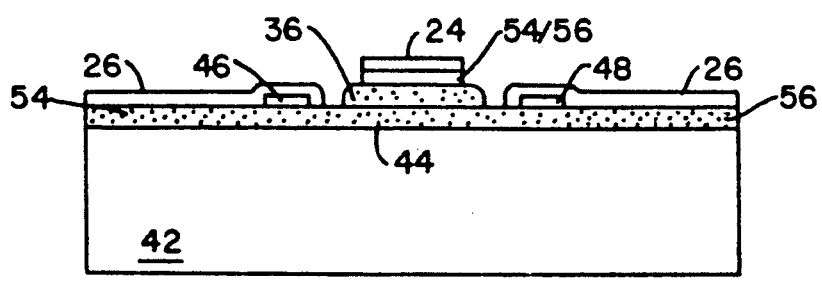
FIG. 10 is a cross sectional view of another embodiment of the invention through the diode area.
Figure 11:
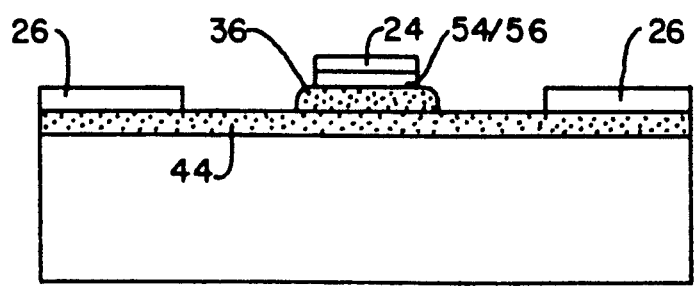
FIG. 11 is a cross sectional view of another embodiment of the invention through a region outside the diode isolation island.

FIGS. 10 and 11 show an alternative embodiment of the invention. FIG. 10 is a cross-section through one of the diodes of a nonlinear transmission line where the N$^-$ epitaxial layer has been etched away at all locations except the area under the Schottky diode anode contact.

FIG. 11 shows a cross-section through the transmission line at a location other than the location of a diode active area.

Figure 12:
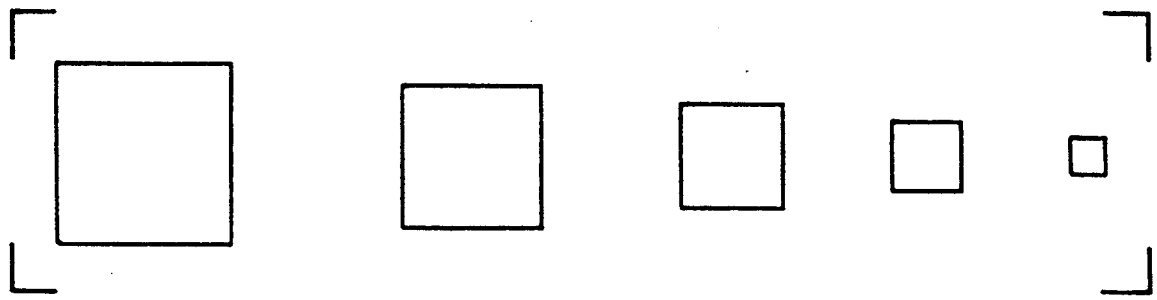
FIG. 12 is a schematic plan view of an embodiment of the invention wherein the diode junction areas are successively smaller and the spacing between diodes becomes progressively smaller.

FIG. 12 schematically shows another alternative structure according to the teachings of the invention. In this structure, the diode junction areas are decreased at each diode location from the input of the line to the output. Further, the spacing between the diodes is scaled in proportion to the decrease in the junction area such that the characteristic impedance of the line remains approximately 50 ohms. The purpose of such an embodiment is to achieve improved performance. This improved performance results from the recognition that as the signal propagates down the line, its fall time is compressed and the high frequency components in the spectrum of the signal therefore increase. These high frequency components change the impedances presented by the capacitances of the diodes and the inductance of the coplanar wave guide sections unless the size of the junction and the spacing between the junctions is altered. FIG. 12 shows the junction areas and junction spacings from plan view only. All other details of the construction are as previously described. Another possible embodiment is to construct the transmission line in segments, each segment containing a plurality of diodes. In the first segment, the diodes will have a first junction area in a first spacing. In the second segment, the junctions will all be the same size but smaller than the size of junctions in the first section. Further, the spacing between the diodes in the second section will be closer in proportion to the decrease in the junction area so as to maintain the characteristic impedance of that section at approximately 50 ohms. This pattern of ever-decreasing junction area and spacing between the diodes in each section is repeated until the appropriate length for the transmission line is achieved. The first several sections are designed to maximize the change in delay with voltage, thus reducing the total number of diodes required for a given input falltime $T_{f,in}$. The later sections with smaller geometries have higher diode and periodic cutoff frequencies, and are optimized to obtain the shortest possible output falltimes.

Figure 13:
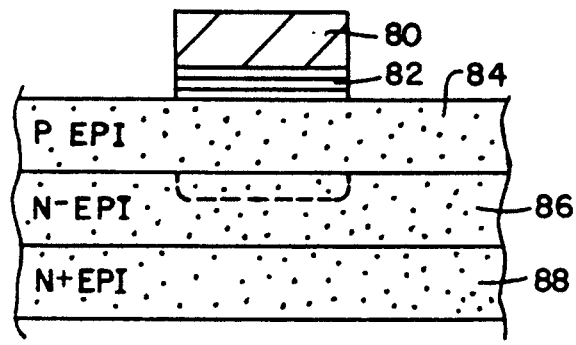
FIG. 13 is a cross sectional view of the diode region of another embodiment of the invention.

Other possible structures which can be used to achieve compression according to the teachings of the invention are any capacitance which is voltage dependent. Thus, for example, regular PN diode junctions could be used as opposed to Schottky diodes to create the nonlinearity and voltage-dependent propagation velocity needed to achieve the compression. A cross-section of the diode portion of the transmission in such an embodiment is shown in FIG. 13. In the diode structure of FIG. 13, layer 80 is a gold diode contact. Layer 82 is an ohmic contact. Layer 84 is P type epitaxial gallium arsenide which is doped to give a minimum amount of series resistance in current flow through the P epitaxial layer 84, to the N$^-$ epitaxial layer 86. The N$^-$ epitaxial layer 86 is formed and doped in accordance with the description given above for the epitaxial layer 36. Finally, the N$^+$ epitaxial buried layer 88 is formed and doped in accordance with the description of the N$^+$ epitaxial layer 44 given above. In alternative embodiments, the P type epitaxial layer 84 could be doped P$^-$.

Figure 14:
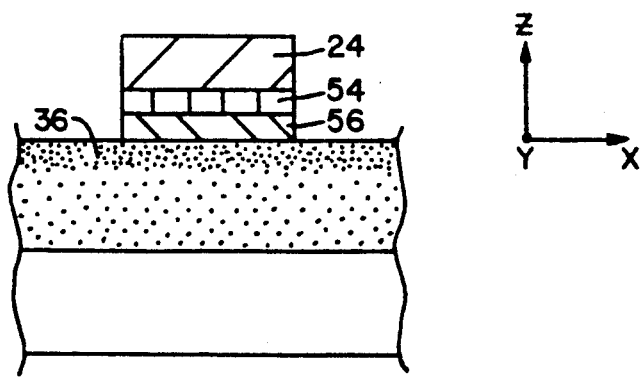
FIG. 14 is a cross sectional view of the diode region of another embodiment of the invention.

In yet another alternative embodiment, hyperabrupt Schottky contacts are used to fabricate a line which otherwise has the construction shown in either FIGS. 2 and 4 or FIGS. 10 and 11. Such a hyperabrupt junction is represented by FIG. 14 where the increased density of the dot pattern near the surface of the N$^-$ epitaxial layer represents a heavier doping there. A hyperabrupt Schottky contact requires that the N$^-$ epitaxial layer have a nonuniform doping. Such an N$^-$ layer is lightly doped at the N$^-$/N$^+$ epitaxial layer junction. This doping increases as one moves through the N⁻ epitaxial layer in the positive Z direction. Such a doping profile can be manufactured using molecular beam epitaxy, liquid phase epitaxy or MOCVD. It is also possible to form such a nonuniform doping profile using ion implantation. In such an embodiment, the N⁻/N⁺ epitaxial layers would be formed with molecular beam epitaxy and doped using an ion implantation. The doping profile is adjusted to make the capacitive changes linear for linear changes in the instantaneous line voltage applied to reverse bias the junction. In the preferred embodiment, the change in capacitance for a unit change in reverse bias voltage is-.nonlinear in that for higher levels of voltage, the unit change in applied reverse bias voltage produces less change in the capacitance than a unit change in voltage at a lower voltage causes. By adjusting the doping profile appropriately, the changes in capacitance for a given change in voltage can be made linear throughout the range of voltages of the input signal. The main reason for using hyperabrupt junctions is to get larger changes in capacitance per unit change in voltage. That is, with a hyperabrupt junction, the capacitance of the resulting junction varies more rapidly with voltage than the capacitance of a junction with uniform doping, producing a greater change in line delay with input voltage. For a given input signal fall-time $T_{f,in}$, the required number of diodes and hence the required line length is decreased.

Another alternative embodiment according to the teachings of the invention is to reduce the size of the overall die using spiral inductor sections to replace the inductive transmission line sections marked XX in FIG. 4. The spiral inductor sections are publicly known and exist on various devices manufactured by Pacific Monolithics of Sunnyvale, Calif.

Figure 15:
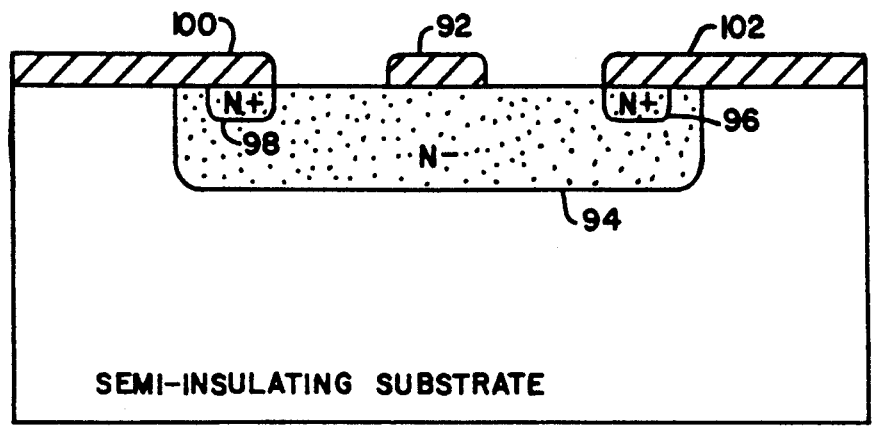
FIG. 15 is a schematic cross sectional view of another embodiment of the invention.

Another alternative embodiment which could be used according to the teachings of the invention is in the form of a monolithic coplanar wave guide loaded periodically with the gate capacitances of a series of MESFET's. A cross-section through the MESFET of such a device is shown in FIG. 15. In such a device, layer 92 is the gate metal and layer 94 is N⁻ epitaxial gallium arsenide lying on top of a substrate of gallium arsenide (not shown). Layers 96 and 98 are N⁺ epitaxial layers which make contact with source and drain metal contacts 102 and 100.

Figure 16:
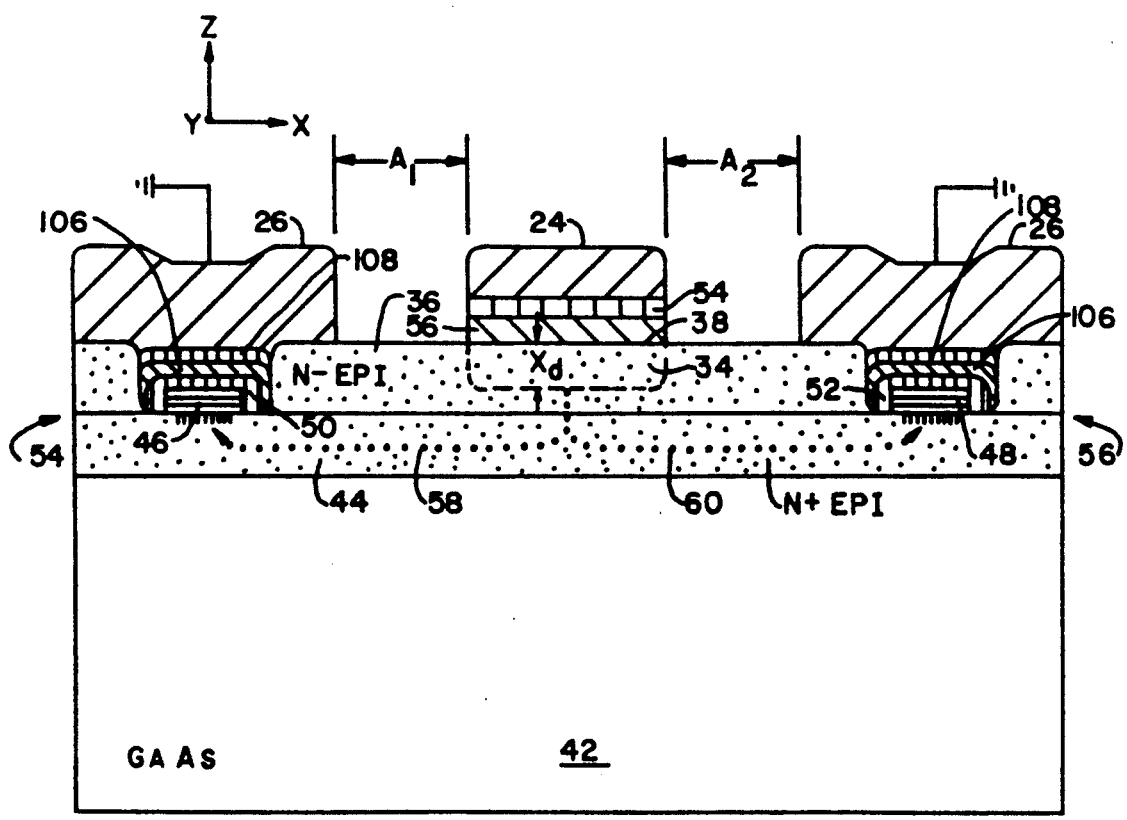
FIG. 16 is the structure which results from carrying out the process of Appendix B.

A detailed process schedule for the preferred embodiment of a process according to the teachings of the invention is given in Appendix B. The process schedule of Appendix B results in a structure as shown in FIG. 16. The only difference between the structure of FIG. 16 and that shown in FIG. 2 is the existence of the additional layers of titanium 106 and platinum 108 above the ohmic contact metal. These additional layers do not affect the resistivity of the contacts substantially.

Alternative process technology can also be used to fabricate the device structures described above. Although in the preferred embodiment of the process according to the teachings of the invention, a standard $NH_4OH/H_2O_2/H_2O$ gallium arsenide wet etch is used to give good etch depth control needed for etching through the N⁻ layer to the buried N⁺ layer for the ohmic contact and initial alignment marking etch, other etch processes may also be used. For example, dry etch or plasma etch processes may be used if sufficient depth control can be achieved to prevent etching through the N⁺ epitaxial layer. Dry etches create surface states, but it is possible that these surface states can be etched away with a mild wet etch following the dry etch.

In the preferred embodiment, ohmic metallization is a typical germanium-nickel-gold eutectic mixture deposited by electron beam evaporation and alloyed in a rapid thermal annealer. The rapid thermal anneal process is faster, easier, cheaper and more reproducible than a conventional oven anneal process and is therefore preferred. Ohmic contacts of 0.06 ohms/mm resistivity have been achieved which is much lower than the typical values quoted for oven annealed contacts (typically 0.5 to 5 ohm-mm). Although this ohmic contact metallization is achieved using liftoff metallurgy (additive) it is also possible to perform this metallization as well as the other metallizations in the process using subtractive etching processes. Either wet etch or dry etch processes may be used for the subtractive etching. The liftoff technology avoids problems of semiconductor surface etching, and is therefore preferred.

The implant isolation masking is an important step. Since high energy, high dose proton implant masking is required, the preferred embodiment uses a 1.6 micron layer of gold on top of a polyimide layer. This layer is patterned using a thick metal liftoff process. However, this implant mask could also be performed by subtractive processing using either wet or dry etches to define the implant mask. The liftoff process works quite well, and the metal thickness for the gold layer can even be increased to provide better implant masking. Better implant masking permits higher implant energies, which will result in a greater depth of penetration of the implant into the N⁻ layer 36 and the N⁺ semiconductor layers A thicker N⁺ layer can then be used, reducing the diode series resistance, as is described subsequently. Thicker metal on the implant mask for subtractive processing means longer etch times and possibly lateral etch problems if wet etches or isotropic dry etches are used for subtractive processing. Therefore, liftoff processing is preferred.

Although the final level interconnect metallization requires very thick layers of gold, subtractive etch processing may also be used for this metallization as opposed to the thick metal liftoff process currently used in the preferred embodiment of the process. The thick metal of this metallization is necessary to achieve low line series resistance. This resistance is currently 12 ohms in the preferred embodiment.

As geometries are scaled down to achieve higher performance levels, self-alignment techniques for the fabrication will become more important. Currently, the Schottky diode junction area and the ohmic contacts are formed using self-aligned process steps. In alternative embodiments, the spacing between the central metal conductor 24 and the ground plane conductors 26 may also be performed using self-aligned processes.

Finally, in the preferred embodiment, the N⁺ epitaxial layer 44 is formed at a thickness of 0.8 microns to keep the resistance of the current paths 58 and 60 in FIG. 2 to a minimum. Thicker layers for this epitaxial layer 44 may be used to further lower their resistance. However, for areas outside the diode isolation island, isolation implantation must be performed. Where thicker layers of epitaxial material 44 are used, higher energies for these isolation implants will be necessary. Alternatively, some etch step may be used to remove the epitaxial layers at regions outside the isolation islands. Preferably, this etch step should be self-aligned so as to not destroy the ohmic contacts 46 and 48.

It is also possible to use self-aligned gate techniques to align the Schottky junction area between the ohmic contacts when the dimensions of the structure are scaled to very small geometries. One possibility is to use refractory metal gates in a T shape. The bottom of the T then serves as the Schottky contact while the top of the T serves as an etch mask to define the positions of the inner edges of the contact windows for the ohmic contacts.

Although the invention has been described in terms of the preferred and alternative embodiments disclosed herein, those skilled in the art will envision other embodiments which may be used without departing from the teachings of the invention. All such embodiments are intended to be included within the scope of the claims appended hereto.

Appendix A

[1] $$Z_0(V) = \sqrt{L/C_T(V)}$$

Various parameters of interest:

$Z_0(V)$ = the small-signal characteristic impedance of the transmission line as a function of voltage, V, $L = Z_1 \tau$ = inductance of the interconnecting transmission lines, per section, $C_T(V)$ = the total capacitance per section as a function of voltage, $V$ = the instantaneous voltage at any particular point on the line, $\tau = (P/c_0)\sqrt{(1+\epsilon_r)/2}$ = the electrical spacing of the Schottky varactor diodes in time units, $P$ = the electrical spacing of the Schottky varactor diodes in distance units, $\epsilon_r$ = dielectric constant of gallium arsenide $\approx$ 12.5, $c_0$ = speed of light in vacuum, $Z_1$ = characteristic impedance of the interconnecting transmission line.

[2] $$C_T(V) = [C_j(V) + C_L] = \text{total capacitance per section},$$

where,

[3] $C_L = \tau/Z_1$ = the capacitance of the interconnecting transmission lines, per section, and,

[4] $C_j(V) = C_{j0}/\sqrt{1 - V/\phi}$ = the transition capacitance of a step junction diode with a junction potential $\phi$, where in the preferred embodiment, $C_{j0}$ = 50fF at 160$\mu$m spacings along a 90$\Omega$ coplanar waveguide transmission line, and $\phi \simeq 0.8$ volts.

[5] $$T(V) = \sqrt{LC_T(V)}$$

where, $T(V)$ = the group delay of the transmission line.

[6] $$\omega_{per} \simeq 2/\sqrt{L(C_{ls} + C_L)} = 2/[Z_{ls}(C_{ls} + C_l)],$$

where $C_{ls}$ is defined by equation (10) and $Z_{ls}$ is defined by equation (12).

[7]
$$\omega_{rc} = 1/r_s C_j(V) \approx 1/r_s C_{ls},$$

where, $r_s$ = the varactor series resistance $\approx 10\Omega$.

[8]
$$T_{f,out} \simeq \max \begin{cases} T_{f,min}, \\ T_{f,in} - n[T(V_h) - T(V_l)]. \end{cases}$$

where, $n$ = the number of sections in the transmission line, and $V_h$ and $V_l$ are the high-level voltage and low-level voltage of the input signal.

[9]
$$Z_1 C_{ls} \omega_{per} \sin(\omega_{per}\tau)/2 = \cos(\omega_{per}\tau) + 1,$$

where,

[10]
$$C_{ls} = \frac{[Q(V_h) - Q_(V_l)]}{(V_h - V_l)},$$

where in the preferred embodiment, $C_{ls} \gg C_l$.

[11]
$$V_{out}(t) = V_{in}[t - nT(V)],$$

where $T(V)$ is given by equation (5) above.

[12]
$$Z_{ls} = \sqrt{\frac{L}{C_{ls} + C_l}}$$

$Z_{ls} \simeq 50\Omega$ for a 0 to -2 volt step-function input with the structure of Figures 2 and 4 on a 90$\Omega$ coplanar waveguide loaded by 45 diodes with $10\mu m \times 10\mu m$ junction area on an N- layer doped to $3 \times 10^{16}/cm^3$ at $160\mu m$ spacings.

Process for Fabrication of Nonlinear Transmission Lines

This process is for fabrication a nonlinear transmission line pulse compressor; starting material for the nonlinear transmission line is a .6 μm N- layer (3X10^16) above a a .8 μm N + layer (3X10^18) on a [100] semi-insulating GaAs substrate.

Self-Aligned Ohmic Contacts

In this step the N- layer is first etched to expose the N+ layer. Ohmic metal is then evaporated and lifted off using the same photoresist which served as an etch mask. The alignment marks are also on this mask layer.

Photoresist

Use AZ 5214 and follow standard photoresist procedure (attached)

resist thickness: 1.55-1.65 μm

Wet Etch
   Use NH4OH:H2O2:H2O (14 : 2.4 : 200) in room-temperature H2O bath
   Etch to 0.75 μm depth
Evaporate Metal
   Etch wafer for 60 seconds in 6:1 BOE immediatly prior to evap.
   Evaporate
      500 Angstroms Eutectic (88%-12%)Au-Ge
      100 Angstroms Ni
      2000 Angstroms Au
Lift Off
   Soak wafers 30 minin cool acetone
   spray with acetone to remove metal
   If necessary, Ultrasonic clean to remove metal residue
   Acetone, isopropyl, and DI water rinse
   N2 dry wafers
Alloy metal at 450°C for 12 seconds in Rapid Thermal Annealer

Proton Implant

Proton implantion is used to electrically isolate N+ regions and to eliminate conductive layers under transmission lines. Protons are implanted into the wafer at high energies, generating ≈3 defect per proton & making the substrate semi-insulating. A thick Au layer defined by liftoff above a polyimide removal layer forms the implant mask.

Wafer clean as per below
Apply Ciba-Geigy polyimide
Spin polyimide adhesion promoter at 5000 rpm for 30 sec
Spin Probimide® 286 at 5000 rpm for 30 sec
Bake polyimide
   Bake at 100°C for 30 min
   Ramp to 180°C, Hold for 15 min at 180 +/- 5°C
   Ramp to 240°C, Hold for 15 min at 240+/- 5°C
   Let oven cool down to 150°C before removing wafers
Photoresist
   Follow the "Liftoff photoresist" proceedures
      Increase exposure time by about 10% to compensate
      for the low reflectivity of polyimide.
Evaporate Metal
   100A Ti
   1.6um Au
Lift Off Metal
   Soak wafers 30 min in cool acetone
   spray with acetone to remove metal
   If necessary, ultrasonic clean to remove metal residue
   Acetone, isopropyl, and DI water rinse
   N2 dry wafers Etch Polyimide
>Etch in polyimide Etcher, Ciba-Geigy QZ 3296, for 150 sec
Rinse in Etch Rinse, Ciba-Geigy QZ 3297, for 30 sec
Rinse in DI H2O for at least 30 sec
N2 dry Implant Hydrogen, 7E14/cm^2 at both 110 and 160 keV
Strip polyimide and gold
>Soak in hot polyimide thinner (Ciba-Geigy) to remove gold and polyimide
Use ultrasonic bath as necessary to aid in removal Ash polyimide residue in oxygen plasma asher
>Ash at low - medium power

Schottky and Interconnect Metal

This mask step replaces both the Schottky and interconnect metal steps. We put down thick (Ti/Pt/Au) metal on the transmission line pattern. Only where the substrate has been masked from proton isolation will a Schottky be formed- at all other points we get metal on insulating dielectric.

Photoresist
>Follow "Liftoff Photolithography directions but:
...increase exposure ≈20% to fully expose ohmic etch holes
... and develop in dark Evaporate
>Etch wafer in BOE for 60 secs immediately prior to evaporation
Evaporate
>>1000 A Ti
750 A Pt
1.4 μm Au Lift Off
>Soak wafers 30 min in cool acetone
spray with acetone to remove metal
If necessary, ultrasonic clean to remove metal residue
Acetone, isopropyl, and DI water rinse
N2 dry wafers

Processing: Appendix Sections

Wafer Cleaning
>2 minutes in boiling Trichloroethane
2 minutes in hot Acetone
2 minutes in boiling Isopropyl
DI water rinse
Nitrogen dry
dehydration bake 120°C 30 minutes

Standard Photoresist
>Surface Preparation
>>Solvent Clean (see above)
Dehydration bake 120 °C 30 minutes
Let wafer cool 5-10 minutes Photoresist application
   Spin AZ 5214e for 40 seconds at 3000 rpm
Soft bake in convection oven for 25 minutes at 90°C
   Times given are for baking small pieces on an open petri dish on the top shelf of a Blue-M oven.
Expose 13 sec @14.8 mW/cm^2 on the Suss aligner for AZ 5214e
   This formulation is for 300 nm exposure on the Suss through a BOROSILICATE mask.
Development
   Develop 50 seconds in 1:1 solution AZ developer: H2O
      Development may have to be done in the dark if two distinct metallizations are on the substrate (battery effect).
   use 2-beaker development with last 15 seconds in "clean" developer
   Rinse in DI for 2 minutes
   Nitrogen dry
Postbake 90°C, 30 minutes

Liftoff Photoresist (Metallization)

Clean Wafer (see above)
Spin AZ 5214e photoresist for 40 seconds at 3000 rpm
Soft bake in convection oven for 25 minutes at 75 °C
   Time given is for baking small pieces on an open petri dish on the top shelf of a Blue-M oven.
Align and expose
   For Suss at 310 nm exposure: 13 Seconds @ 14.8 mW/cm^2 through borosilicate mask.
Chlorobenzene
   Soak for 15 minutes in undiluted chlorobenzene
   Nitrogen dry
Development
   Develop 1.5 to 1.75 minutes in 1:1 AZ solution developer: H2O (watch)
      We (MR & CM) have decided that the best method here is to watch the development. When large (visible) areas on the wafer have cleared, transfer to the "clean" beaker for the final 15 seconds.
   two-beaker method: last 15-30 seconds in "clean" beaker of developer
   Rinse in DI water for 2 minutes
   Nitrogen dry
Pre-evaporation clean
   Just before placing wafers in evaporator, do a 60 second buffered oxide etch in a teflon beaker.
Evaporate desired metal(s)
Lift Off Soak wafers 30 min in cool acetone
spray with acetone to remove metal
If necessary, ultrasonic clean to remove metal residue
Acetone, isopropyl, and DI water rinse
N2 dry wafers

What is claimed is:

1. An apparatus comprising:

a coplanar waveguide nonlinear transmission line for compressing the fall time of an input signal applied to an input thereof to generate an output signal at an output having a shorter fall time than said input signal, said nonlinear transmission line being integrated on a substrate of semiconductor material having islands of doped, conductive semiconductor along said transmission line surrounded by areas of said substrate which have been rendered nonconductive, said transmission line having a center conductor of constant width and at least two ground plane conductors spaced apart from said center conductor on either side of said center conductor, said center conductor-to-ground plane conductor spacing alternating between a first dimension and a second larger dimension at selected points along said transmission line, said first dimension being the smallest allowable spacing permitted by the design rules under which the integrated transmission line is fabricated, said second dimension selected in conjunction with the size and spacing of said islands to yield a desired, selected characteristic impedance of said transmission line which results in a usable, not excessive attenuation value for attenuation of signals propagating along said transmission line;

means integrated in said substrate coupled to said transmission line for causing the group velocity for propagation of said input signal toward said output to be voltage dependent at each point along said transmission line including a buried layer of heavily doped semiconductor under said islands.

2. The apparatus of claim 1 wherein said means for causing voltage dependence of the group velocity is a plurality of varactor diodes integrated on said substrate in said islands and electrically connected between said center conductor and said ground plane conductors of said transmission line at spaced apart points, and wherein said varactor diodes and said transmission line include means for reducing the attenuation along said transmission line to a minimum attainable value.

3. The apparatus of claim 2 wherein each said varactor diode is a Schottky diode comprising a metal anode contact, a lightly doped semiconductor layer, a heavily doped buried semiconductor layer having the same impurity type as said lightly doped semiconductor layer, and an ohmic contact, said metal anode contact in electrical contact with said lightly doped semiconductor layer to form a Schottky diode junction, and said lightly doped semiconductor layer in electrical contact with said heavily doped semiconductor layer, and said ohmic contact in electrical contact with said heavily doped semiconductor layer and said metal ground plane.

4. The apparatus of claim 3 further comprising means for reducing series resistance of each said Schottky diode comprising a maximum level of doping of said heavily doped semiconductor layer and minimum design rule spacing between said anode contact and said cathode contact according to the design rules for an integrated circuit process used to manufacture said apparatus on an integrated circuit substrate.

5. The apparatus of claim 4 wherein said diodes have junction areas which are periodically spaced along and coupled to said transmission line, and wherein said junction areas and spacing of said varactor diodes is established such that the characteristic impedance of said apparatus is a desired, selected impedance.

6. The apparatus of claim 5 wherein said junction areas get progressively smaller for varactor diodes coupled to said transmission line further from said input and wherein the spacing of the connection of each said varactor diode to said transmission line gets progressively less in proportion to the decrease in junction area of each said varactor diode.

7. An integrated nonlinear transmission line comprising:

a semiconductor substrate;

a layer of doped epitaxial material formed on said substrate having a lightly doped layer and a heavily doped buried layer under said lightly doped layer formed in said substrate and having regions of ion implant damage to form spaced-apart, electrically isolated islands of epitaxial material;

a coplanar transmission line center conductor of constant width integrated on said substrate so as to be in electrical contact with said lightly doped layer at least at the locations of said isolation islands thereby forming Schottky varactor diodes; and a pair of coplanar transmission line groundplane conductors integrated on said substrate and overlying a plurality of ohmic contacts formed in said islands so as to be in direct electrical contact with said heavily doped buried layer to form a Schottky varactor diode cathode contact structure in each said island, said pair of groundplane conductors having a spacing from said center conductor over said islands which is approximately equal to the minimum acceptable spacing allowed by the design rules used to fabricate said integrated nonlinear transmission line, and having a spacing from said center conductor in regions outside said islands which is selected in conjunction with selection of the areas and spacings of said islands to establish a desired characteristic impedance for said integrated nonlinear transmission line which will match the characteristic impedance of devices to be electrically coupled to and used with said nonlinear transmission line.

8. The apparatus of claim 7 wherein said center and ground plane conductors are formed on the surface of said epitaxial layer to form a coplanar waveguide transmission line and wherein said Schottky diode junctions are the self aligned intersections of said isolated islands and said center conductor.

9. The apparatus of claim 8 wherein the spacing between said isolated islands, the size of said Schottky diode junction areas and the center conductor to ground plane conductor spacings are selected to yield a characteristic impedance for said transmission line of approximately 50 ohms.

10. The apparatus of claim 9 wherein the spacing of said isolated islands is periodic.

11. The apparatus of claim 9 wherein each succeeding junction area is smaller and the spacing of each succeeding isolated island starting from said input of said nonlinear transmission line is decreased in an amount to yield a characteristic impedance for the transmission line of approximately 50 ohms.

12. An integrated circuit comprising:
a semiconductor substrate having a nonlinear transmission line integrated thereon having at least a center conductor and a ground plane conductor and having a plurality of first regions comprising doped, conductive isolated islands formed therein surrounded by and electrically isolated from each other by second regions comprising ion implant damaged areas of nonconducting semiconductor substrate, said nonlinear transmission line comprised of a center conductor having constant width and at least two ground plane conductors spaced apart from said center conductor by a gap, said gap within said isolated islands having a width equal to the minimum allowable spacing under the design rules for the fabrication process used to form said integrated circuit and having a width in said second regions between said isolated islands which is selected to yield a capacitance and inductance per unit length of said nonlinear transmission line which will cause the characteristic impedance of said transmission line to be a desired value when considered with the area and spacing of said islands;
a plurality of junction means each including a junction having a junction area and a series resistance formed in said isolated islands, each having a transition capacitance which is voltage dependent, each said junction means coupled to said nonlinear transmission line at spaced intervals and inside the perimeter of an isolated island, said spacing of said junction means and said junction area being sized so as to cause said transmission line to have a desired, selected characteristic impedance when considered with the spacing between junctions, the series resistance and the capacitance and inductance per unit length of said nonlinear transmission line, said junction means for causing the group velocity of propagation along said transmission line to be voltage dependent.

13. The apparatus of claim 12 further comprising a lightly doped epitaxial layer in said substrate having a doping profile and in electrical contact with an underlying heavily doped epitaxial layer wherein each said junction means comprises a Schottky diode formed with an anode metal contact electrically coupled to said center conductor of said transmission line and in electrical contact with said lightly doped epitaxial layer and formed with an ohmic cathode contact electrically coupled to said ground plane conductor of said transmission line and in direct electrical contact with said heavily doped epitaxial layer, said heavily doped epitaxial layer also being in electrical contact with said lightly doped epitaxial layer.

14. The apparatus of claim 13 wherein said lightly doped epitaxial layer is uniformly doped between the surface of said substrate in contact with said anode metal contact and the junction between said lightly doped epitaxial layer and said heavily doped epitaxial layer.

15. The apparatus of claim 13 wherein each said Schottky diode is a hyperabrupt junction with a nonuniform doping profile of said lightly doped epitaxial layer.

16. The apparatus of claim 13 wherein said doping profile of said lightly doped epitaxial layer is chosen to cause the change in transition capacitance to be linear over the range of voltages of signals as they propagate down the transmission line.

17. An integrated nonlinear transmission line for causing the fall time of an input signal to be compressed during propagation from an input to an output comprising:
a gallium arsenide substrate;
a first epitaxially grown layer of doped single crystal gallium arsenide formed on said substrate which is uniformly doped throughout the thickness thereof to doping levels on the order of $10^{18}$ donor atoms $cm^3$;
a second epitaxially grown layer of single crystal gallium arsenide layered adjacent to said first epitaxially grown layer and doped to doping levels on the order of $10^{16}$ donor atoms/$cm^3$, and further comprising isolation islands of each of said first and second epitaxial layers electrically isolated from each other and periodically spaced along said transmission line;
a first Schottky metal conductor of constant width running across the surface of said second epitaxial layer to form the center conductor of an integrated coplanar waveguide transmission line comprising said nonlinear transmission line and intersecting said islands to form a self-aligned Schottky diode junction at each intersection thereby forming a plurality of Schottky junctions each of which has an area which is related to the spacing between said islands so as to cause a selected, desired characteristic impedance for the transmission line;
a plurality of ohmic contacts formed in said isolation islands through said second epitaxial layer to make electrical contact with said first epitaxial layer; and
a pair of metal ground plane conductors running across the surface of said second epitaxial layer and over each said ohmic contact so as to form the ground plane conductor of said integrated coplanar waveguide transmission line, the spacing of said ground plane conductors from said Schottky metal conductor over said isolation islands and in regions between said isolation islands selected so as to establish said selected, desired characteristic impedance when considered with the junction areas and spacing of said isolation islands.

* * * * *